(12) United States Patent
Zhou et al.

(10) Patent No.: US 8,971,100 B2
(45) Date of Patent: Mar. 3, 2015

(54) INITIALIZATION METHOD OF A PERPENDICULAR MAGNETIC RANDOM ACCESS MEMORY (MRAM) DEVICE

(75) Inventors: Yuchen Zhou, San Jose, CA (US); Yiming Huai, Pleasanton, CA (US)

(73) Assignee: Avalanche Technology, Inc., Fremont, CA (US)

( * ) Notice: Subject to any disclaimer, the term of this patent is extended or adjusted under 35 U.S.C. 154(b) by 353 days.

(21) Appl. No.: 13/546,169

(22) Filed: Jul. 11, 2012

(65) Prior Publication Data

US 2013/0194863 A1 Aug. 1, 2013

Related U.S. Application Data

(63) Continuation-in-part of application No. 13/360,524, filed on Jan. 27, 2012, now Pat. No. 8,559,215.

(51) Int. Cl.
*G11C 11/00* (2006.01)

(52) U.S. Cl.
USPC ........... 365/158; 365/148; 365/171; 977/933; 977/935

(58) Field of Classification Search
USPC ......... 365/48, 55, 62, 66, 74, 78, 80–93, 100, 365/130, 131, 148, 158, 171–173, 209, 213, 365/225.5, 230.07, 232, 243.5; 977/933–935
See application file for complete search history.

(56) References Cited

U.S. PATENT DOCUMENTS

| | | | |
|---|---|---|---|
| 6,744,086 B2 | 6/2004 | Daughton et al. | |
| 6,943,420 B2 | 9/2005 | Jeong | |
| 2005/0083747 A1* | 4/2005 | Tang et al. | 365/210 |
| 2006/0067149 A1* | 3/2006 | Shimizu et al. | 365/210 |
| 2006/0233017 A1* | 10/2006 | Hosotani et al. | 365/158 |
| 2009/0268515 A1* | 10/2009 | Jeong et al. | 365/171 |
| 2010/0109110 A1* | 5/2010 | Wang et al. | 257/421 |

OTHER PUBLICATIONS

Jason Janesky, Impact of External Magnetic Fields on MRAM Products, Freescale Semiconductor Application Note AN3525 Rev. 0, Nov. 2007; On the Internet at http://cache.freescale.com/files/32bit/doc/app_note/AN3525.pdf.
D. C. Worledge, et al.; Spin torque switching of perpendicular Ta/CoFeB/MgO-based magnetic tunnel junctions; Appl. Phys. Lett. 98, 022501(2011); published online Jan. 10, 2011.

* cited by examiner

*Primary Examiner* — Harry W Byrne
(74) *Attorney, Agent, or Firm* — G. Marlin Knight; Bing K. Yen

(57) ABSTRACT

Methods using a sequence of externally generated magnetic fields to initialize the magnetization directions of each of the layers in perpendicular MTJ MRAM elements for data and reference bits when the required magnetization directions are anti-parallel are described. The coercivity of the fixed pinned and reference layers can be made unequal so that one of them can be switched by a magnetic field that will reliably leave the other one unswitched. Embodiments of the invention utilize the different effective coercivity fields of the pinned, reference and free layers to selectively switch the magnetization directions using a sequence of magnetic fields of decreasing strength. Optionally the chip or wafer can be heated to reduce the required field magnitude. It is possible that the first magnetic field in the sequence can be applied during an annealing step in the MRAM manufacture process.

13 Claims, 14 Drawing Sheets

INITIALIZATION METHOD OF A PERPENDICULAR MAGNETIC RANDOM ACCESS MEMORY (MRAM) DEVICE

CROSS REFERENCE TO RELATED APPLICATIONS

This application is a Continuation-In-Part application of commonly assigned, previously-filed U.S. application Ser. No. 13/360,524, entitled "PERPENDICULAR MRAM DEVICE AND ITS INITIALIZATION METHOD" filed on Jan. 27, 2012 now U.S. Pat. No. 8,559,215, which is incorporated herein by reference as if expressly set forth. This application is also related to commonly assigned U.S. patent application Ser. No. 13/360,553, entitled "PERPENDICULAR MRAM DEVICE AND ITS INITIALIZATION METHOD" filed on Jan. 27, 2012.

FIELD OF THE INVENTION

The invention relates generally to fabrication methods for non-volatile magnetic memory elements.

BACKGROUND OF THE INVENTION

Computers conventionally use rotating magnetic media, such as hard disk drives (HDDs), for data storage. Though widely used and commonly accepted, such media suffer from a variety of deficiencies, such as access latency, higher power dissipation, large physical size and inability to withstand any physical shock. Thus, there is a need for a new type of storage device devoid of such drawbacks.

There has been an extensive effort in development of alternative memory technologies such as Ovanic Ram (or phase-change memory), Ferromagnetic Ram (FeRAM), Magnetic Ram (MRAM), Nanochip, and others to replace memories used in current designs such as DRAM, SRAM, EEPROM/NOR flash, NAND flash and HDD in one form or another. Although these various memory/storage technologies have created many challenges, there have been advances made in this field in recent years. MRAM has exceptional advantage when compared to other memory technologies under development in the aspects of speed, write endurance and non-volatility.

Perpendicular MRAM is particularly noteworthy because of its adaptability to sub-30 nano meters (nm) size and high density. However, thermal stability has been a continued problem faced in the design of perpendicular MRAM and is described by thermal stability factor, A, described as follows:

$$\Delta = K_u V / k_B T \quad \text{Eq. (1)}$$

where "Ku" is the perpendicular anisotropy energy density of the storage magnetic layer of the MRAM, "V" is the volume of the storage magnetic layer, "kB" is the Boltzmann constant, and "T" is the absolute temperature (in Kelvin).

This factor inevitably reduces at a given anisotropy energy of the storage magnetic layer resulting in the thermal stability of each bit decreasing. For MRAM applications using extremely high data density, for example dynamic random access memory (DRAM) type of applications, where speed and data capacity are key parameters, lower thermal stability of the data bits may be tolerable, or may be mitigated with reasonable amounts of error correction coding (ECC) to make the overall design function in the targeted regime of application. Perpendicular MRAM currently has a critical dimension of approximately 30 nm progressing toward 10 nm.

Applications of MRAM generally include a selected number of reference MRAM bits, which provide a reference resistance for comparing the reference bits to the MRAM data bits to indicate whether or not the data bits are in high resistance or low resistance state. The reference bit is preferably made of identical MRAM cell structure as that of the data bit because it simplifies both the fabrication process and the circuit design than the case where the reference bit is made of a pure resistor without an MTJ structure. The resistance of the reference element can be found using standard Ohm's Law as a ratio of voltage divided by current, but equivalently the reference comparison value can be a measured current produced by applying a common voltage or a resulting voltage produced by applying a fixed current.

With MRAM reference bit being identical to a data bit, the reference bit has the same low thermal stability problem as indicated above. The standard ECC does not correct reference bit errors. Rather, a special data refreshing and assurance circuit mechanism may be needed to make sure the reference bit is always in the correct state before any read operation on the data bits, which is costly both in design and in operation. Additionally, such refresh mechanism may slow down the operation speed of the device considerably and make the device not usable in high data rate applications.

The magnetization directions of various magnetic layers in MTJ MRAM data and reference elements, such as the pinned layer and reference layer must be initialized in the proper directions in order to function correctly. What is needed are methods of initializing perpendicular MRAM data and reference cells to known, stable states.

SUMMARY OF THE INVENTION

It is an object of the present invention to describe methods that can be used to initialize (set) the magnetization directions of each of the layers in perpendicular MTJ MRAM elements for data and reference bits when the required magnetization directions for the reference layer and pinned layer are anti-parallel. Embodiments of the present invention include methods for using a sequence of externally generated magnetic fields to initialize the magnetization directions of various magnetic layers in perpendicular MTJ MRAM elements as part of the fabrication process. The magnetization of the pinned layer and the reference layer remain fixed during normal operation of a completed MTJ MRAM element and will be referred to collectively as the "fixed layers." The coercivity of the fixed pinned and reference layers can be made sufficiently unequal so that one of them can be switched by a magnetic field that will reliably leave the other one unswitched. In different MTJ designs either the pinned or the reference layer can be designed to have the highest coercivity. The free layer should always have the lowest coercivity. Embodiments of the invention utilize the different effective coercivity fields of the pinned, reference and free layers to selectively switch the magnetization directions using a sequence of magnetic fields of decreasing strength (field magnitude). The first magnetic field to be applied is the strongest and is selected to switch the magnetization direction of all of the layers in the direction of the applied field. The second magnetic field to be applied is weaker than and opposite in direction (antiparallel) to the first field and is selected to leave the highest coercivity magnetic layer (which can be either the pinned or reference layer) unaffected while switching the magnetization direction of all of the other layers in the direction of the applied field. The first and second magnetic fields, therefore, can be used to initialize the pinned and reference layers in anti-parallel directions. Similarly in some embodiments an optional, weaker third field, which is opposite in direction to the second field, can be selected to switch only the free layer which has the lowest coercivity. Optionally the chip or wafer can be heated when any of the external magnetic fields are applied to reduce the required field magnitude to magnetize the target magnetic layer.

The initialization according to the invention is preferably performed after all manufacture processes are completed on a wafer or chip that could alter the magnetizations of the fixed layers. However, in some embodiments it is possible that the first magnetic field in the sequence can be applied during an annealing step in the MRAM manufacture process.

DETAILED DESCRIPTION OF THE PREFERRED EMBODIMENT

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the invention.

Figure 1:
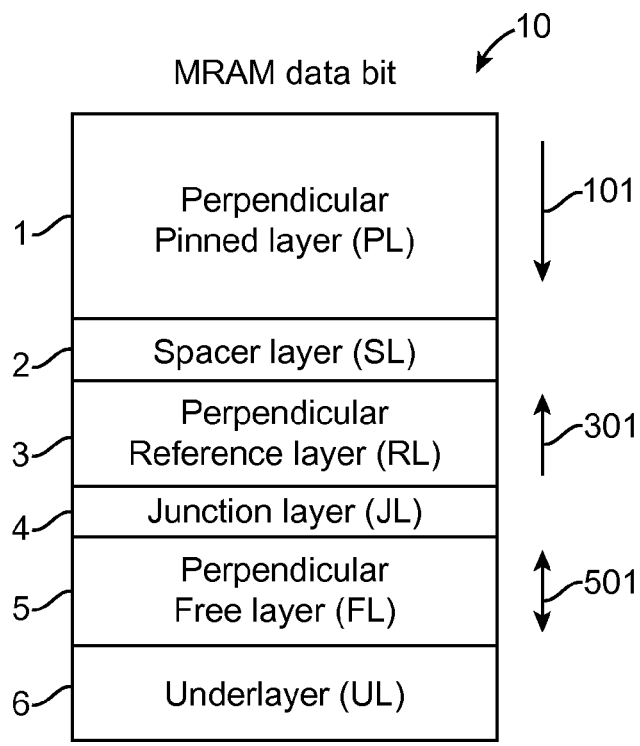
FIGS. 1 and 2 illustrate a MRAM element 10 and a MRAM reference element 20 which will be used with one embodiment of the invention.
Figure 2:
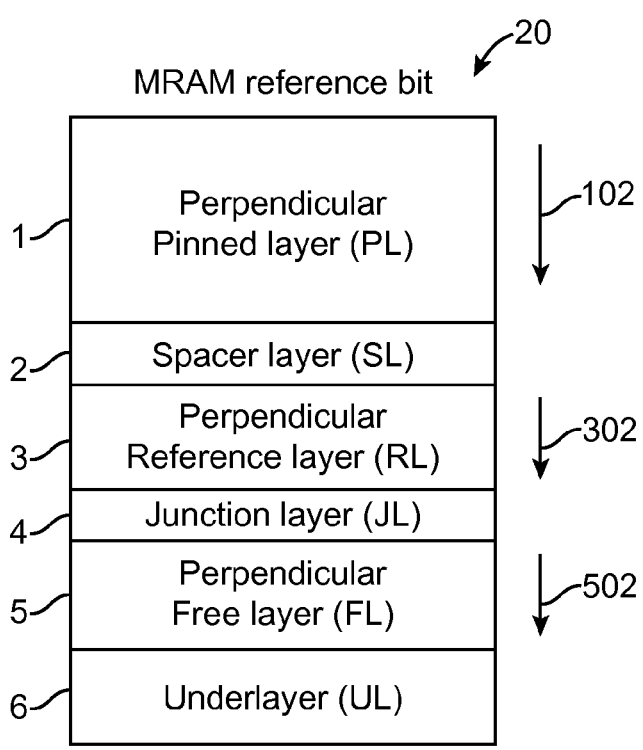

As known to those in the art, reference bits are used to read digital information stored in MRAM data storage elements by comparing the state of the MRAM data storage elements to an associated reference MRAM element and determining, based on this comparison, the resistance state of the MRAM element is read, i.e. the digital information of "1" or "0" is read. With this in mind, FIGS. 1 and 2 show a MRAM element 10 and a corresponding MRAM reference element 20 that will be used in accordance with one of the embodiments of the invention. The invention is not limited to use with this particular element design and can also be used with other designs. Each of the elements 10 and 20 are called "perpendicular" in that their respective free layer (or "reference layer") has a magnetic anisotropy that is perpendicular to the film plane or substrate on which each element is formed.

The element 10 is shown to include an underlayer (UL) 6 formed on suitable pre-patterned circuitry on a substrate (not shown) on top of which is shown formed a perpendicular free layer (FL) 5 on top of which is shown formed a junction layer (JL) 4 (also known herein as "barrier layer" or "tunnel layer" or "barrier tunnel layer"), on top of which is shown formed a perpendicular reference layer (RL) 3 on top of which is shown formed a spacer layer (SL) 2 on top of which is shown formed a perpendicular pinned layer (PL) 1.

Similarly, the reference bit element 20 is made of the same layers as that of the data bit element 10 but it serves as the reference bit to aid in reading the state of the data bit element 10. Accordingly, the elements 10 and 20 are formed with analogous material and structures. At times, in this document, the element 10 is referred to interchangeably as "MRAM data bit" or "data bit" and the element 20 is referred to interchangeably as "MRAM reference bit" or "reference bit" because each of these elements stores one bit of digital information.

The FL 5, JL 4, RL 3, SL 2, and PL 1 generally make up a magnetic tunnel junction (MTJ). This applies to other embodiments of the invention. The FL 5, RL 3, and PL 1 of each of the elements 10 and 20, each have a perpendicular magnetic anisotropy and a magnetization that is perpendicular to the film plane. Different magnetization states in of the two bits, i.e. bits 10 and 20, are achieved after the completion of an initialization process. As shown in FIGS. 1 and 2 the magnetization directions are shown using the arrows 101, 301, 501, 102, 302, and 502. The PL 1 and the RL 3 of the element 10 each have magnetizations that are anti-parallel relative to each other while the PL 5 and the RL 3 of the element 20 have magnetizations that are parallel relative to each other and in the same direction as that of the magnetization of the FL 5 of the element 20. The FL 5 of element 10 is switchable in normal operation by programming current/voltage. The FL 5 of element 20 stays in parallel to PL 1 and RL 3 direction.

In some embodiments, the JL 4 is made of magnesium oxide (MgO), or alumina, or copper (Cu), or Cu nano-pillars dispersed within an oxide layer. In some embodiments, the elements 10 and 20 are each spin transfer torque MRAM (STTMRAM) elements. When a different direction of electric current is applied to and flows through each of the elements 10 and 20, the magnetization of the FL 5, and the magnetization of the RL 3 in some embodiments, thereof may be switched into different orientation along the perpendicular direction due to the spin transfer torque between the FL 5 and the RL 3.

In some embodiments, the SL 2 of each of the elements 10 and 20 is made of non-magnetic material such as but not limited to, ruthenium (Ru), tantalum (Ta), titanium (Ti), MgO, Cu, hafnium (Hf), zinc oxide (ZnO), tantalum nitride (TaN), titanium nitride (TiN), IrMn, PtMn, FeRh or alumina. Further, the SL 2 may produce an anti-ferromagnetic coupling between the RL 3 and the PL 1, particularly when it is made of Ru, Cu or MgO.

Figure 3:
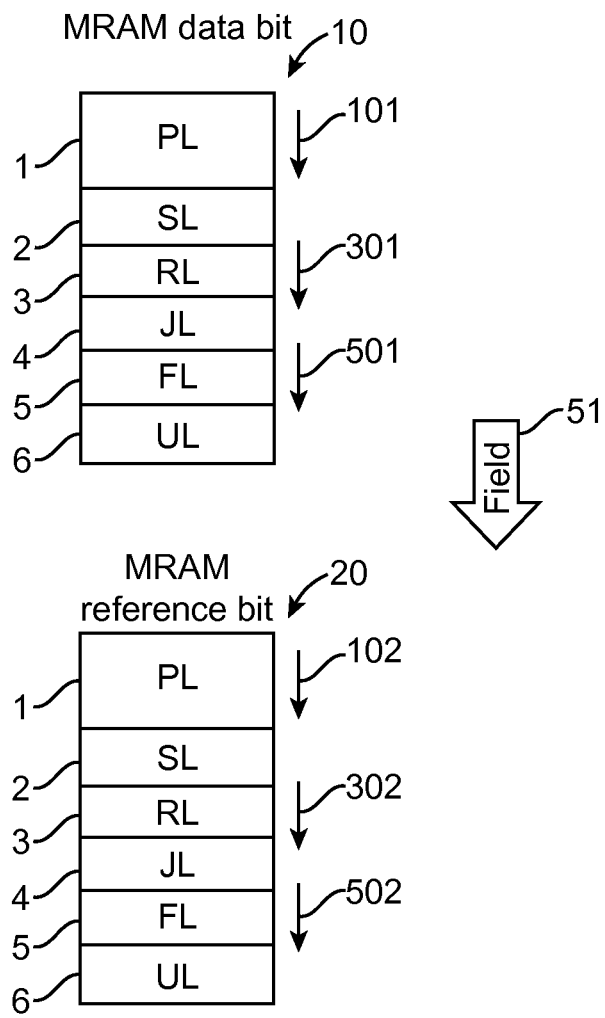
FIGS. 3-5 illustrate a process for initializing the elements 10 and 20 in accordance with a method of the invention.
Figure 4:
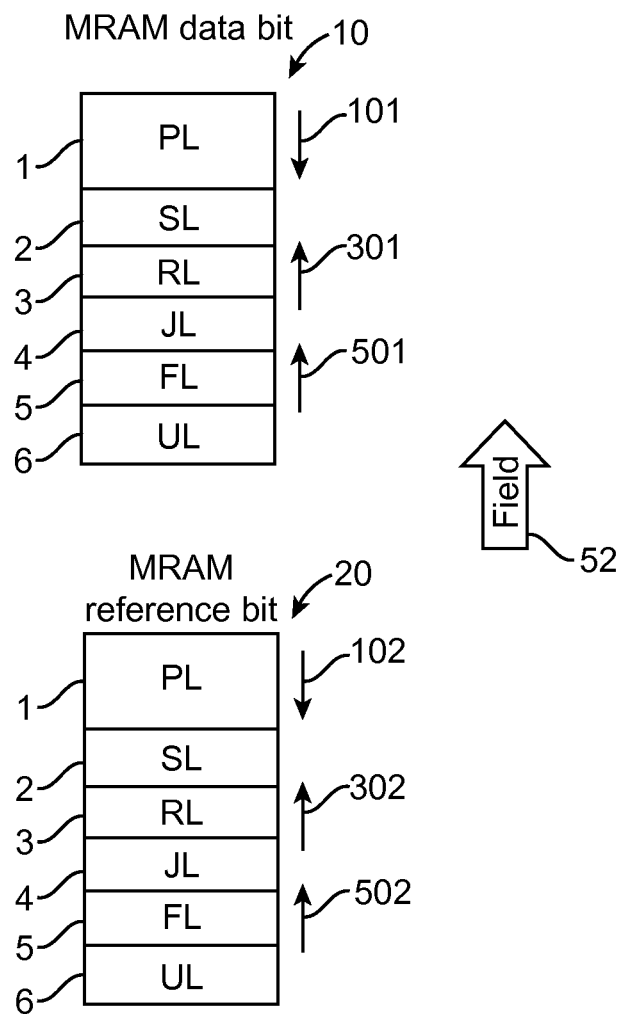
Figure 5:
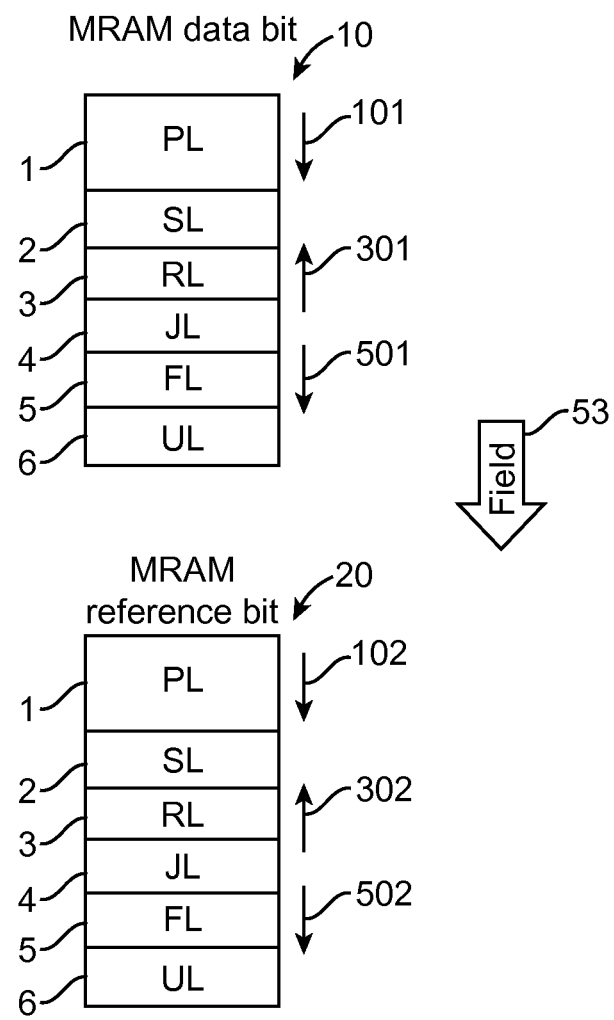

FIGS. 3-5 show the steps performed during an initialization process of each of the elements 10 and 20, in accordance with a first embodiment of the invention, to magnetize both data bit and reference bit into same common state, where RL and PL are anti-parallel to each other. In this process, the PL 1 magnetization is assumed to designed to be harder to switch with a magnetic field (i.e. having a higher effective coercivity field) than the RL 3. Likewise the RL 3 is assumed to designed to be harder to switch with a magnetic field than the FL 5.

Step 1, as illustrated in FIG. 3, an externally generated magnetic field 51, in the direction shown of the arrow, is applied to the elements 10 and 20. The elements will typically be packaged along with many other elements in an array on a chip or wafer with associated read and write circuitry. The externally generated magnetic field in each of the embodiments is applied to the entire chip or wafer.

The field 51 is selected to be strong enough to magnetize all of the magnetic layers of the elements 10 and 20, such as the RL 3 and the FL 5 and the PL 1, in the direction shown as the direction of the arrow showing field 51. Magnetic field 51 is then removed. Next, at step 2, shown in FIG. 4, the externally generated magnetic field 52 is applied. The direction of field 52 is selected to be opposite of field 51. The strength of field 52 is set to be lower than field 51 so that it is not able to switch the PL 1 in either the element 10 or 20, but it is able to switch the magnetization of both of the layers FL 5 and RL 3 such that the magnetizations 301 and 302 of the RL 3 are oriented anti-parallel relative to that of the PL 1 in both the element 10 and the element 20. Step 2 can be used as the final step for certain applications, for example, where reference bit and data bit share same magnetization configuration and when not using a stable reference bit that has magnetizations from all magnetic layers being in same direction.

As an optional step after step 2, as shown in FIG. 5, a third (magnetic) field 53 is applied to the element 10 and the element 20 after field 52 has been removed. The field 53 is in the same direction as that of the field 51. However, field 53 is not strong enough to switch the magnetization of the RL 3 and the PL 1, but it is suitable to switch the magnetization of the FL 5 to be in the same direction as that of the PL 1 in both the element 10 and the element 20. Accordingly, as shown in FIG. 5, the magnetization direction, shown by the arrows 501 and 502, is in the same direction as that of the arrow 101 and 102.

It needs to be noted that some prior art, [for example, D. C. Worledge, G. Hu, David W. Abraham, J. Z. Sun, P. L. Trouilloud, J. Nowak, S. Brown, M. C. Gaidis, E. J. O'Sullivan, and R. P. Robertazzi, Appl. Phys. Lett. 98, 022501(2011)], uses a Ru layer between the RL and PL, where the Ru layer provides an anti-ferromagnetic (AFM) exchange coupling between the RL and PL. Such AFM coupling may automatically rotate RL magnetization to be anti-parallel to that of the PL. However, for commercially viable perpendicular MRAM, RL and PL are generally required to have an effective coercivity field of a few kilo-Oersted, so that they are stable in MRAM MTJ cells with very small physical size, where the AFM coupling of Ru will not be high enough to automatically rotate RL magnetization to be antiparallel to PL. Thus, a field initialization process as proposed herein will be required.

Figure 6:
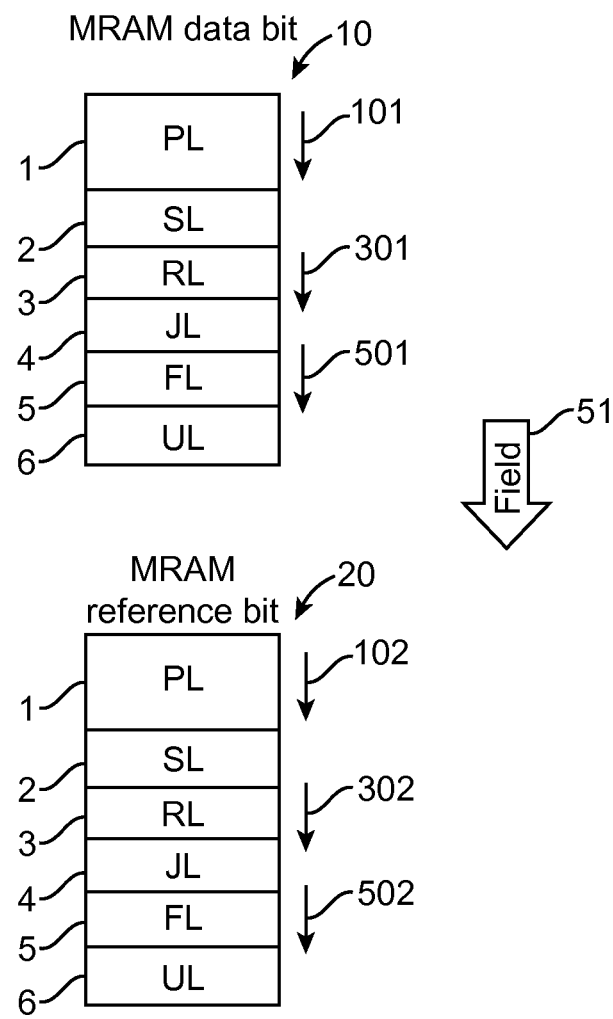
FIGS. 6-8 illustrate a process for initializing the elements 10 and 20 in accordance with another embodiment of the invention.
Figure 7:
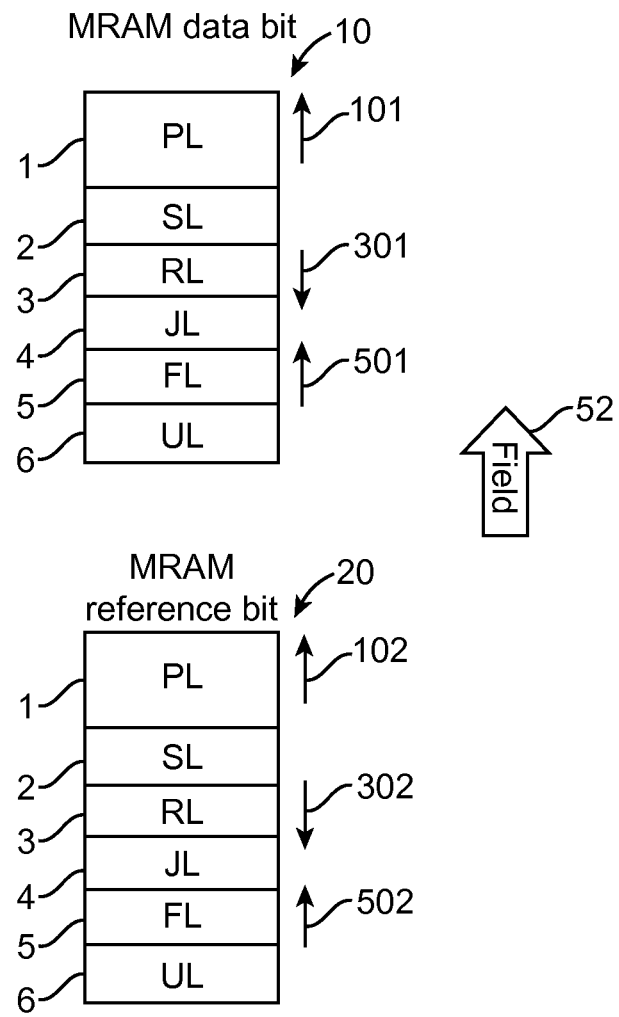
Figure 8:
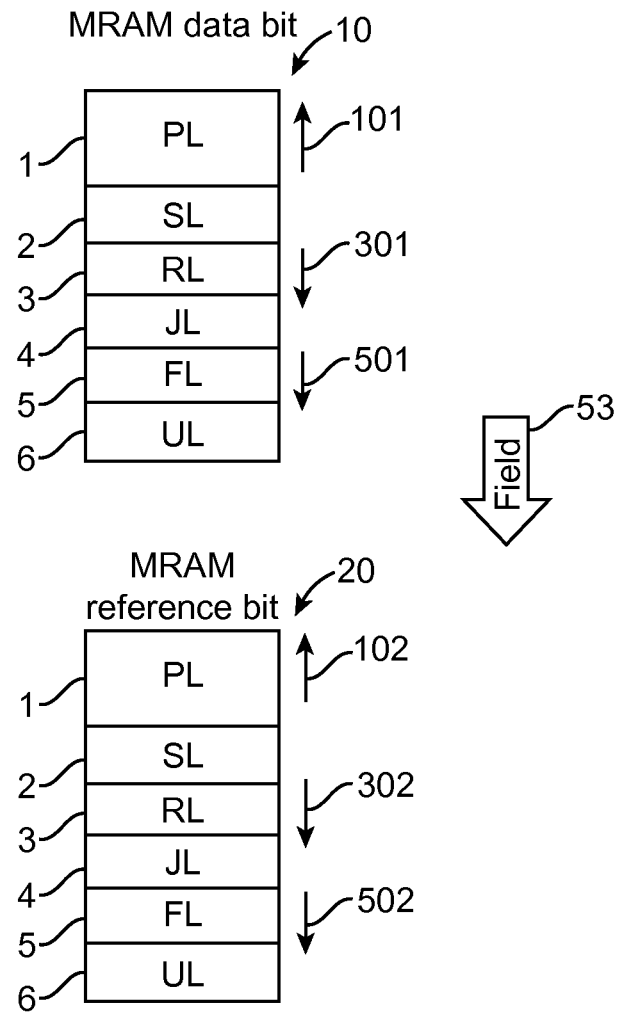

FIGS. 6-8 illustrate a process for initializing the elements 10 and 20, during manufacturing or as needed, in accordance with a second embodiment of the invention, to magnetize (set) both data bit and reference bit into same common state, where RL and PL are anti-parallel to each other. In this process, the RL magnetization is assumed to be harder to switch with a magnetic field (i.e. having a higher effective coercivity field) than the PL.

In step 1, of FIG. 6, a first field 51, having a direction shown by the arrow 51, is applied to the elements 10 and 20. The strength or magnitude of field 51 is selected to be suitably strong enough to magnetize all magnetic layers of the elements 10 and 20 in the same direction as the direction of the field 51. Field 51 is then removed. Next, at step 2, shown in FIG. 7, the field 52 is applied, opposite to the field 51. Field 52 is lower in strength and is not able to switch the RL 3 in either the element 10 or 20, but it is able to switch the magnetization of both of the layers FL 5 and PL 1 such that the magnetizations 301 and 302 of the RL 3 are now oriented anti-parallel relative to that of the PL 1 in both the element 10 and the element 20. In this embodiment step 2 can be used as the final step for certain applications, for example, where reference bit and data bit share same magnetization configuration and when not using a stable reference bit that has magnetizations from all magnetic layers being in same direction.

As an optional step after step 2, as shown in FIG. 8, a third (magnetic) field 53 is applied to the element 10 and element 20 after field 52 has been removed. The field 53 is in the same direction as that of the field 51. However, field 53 is weaker than field 52 and is not strong enough to switch the magnetization of the RL 3 or the PL 1, but it is suitable to switch the magnetization of the FL 5 to be in the same direction as that of the RL 3 in both the element 10 and the element 20. Accordingly, as shown in FIG. 8, the magnetization direction, shown by the arrows 501 and 502, is in the same direction as that of the arrows 301 and 302.

Figure 9:
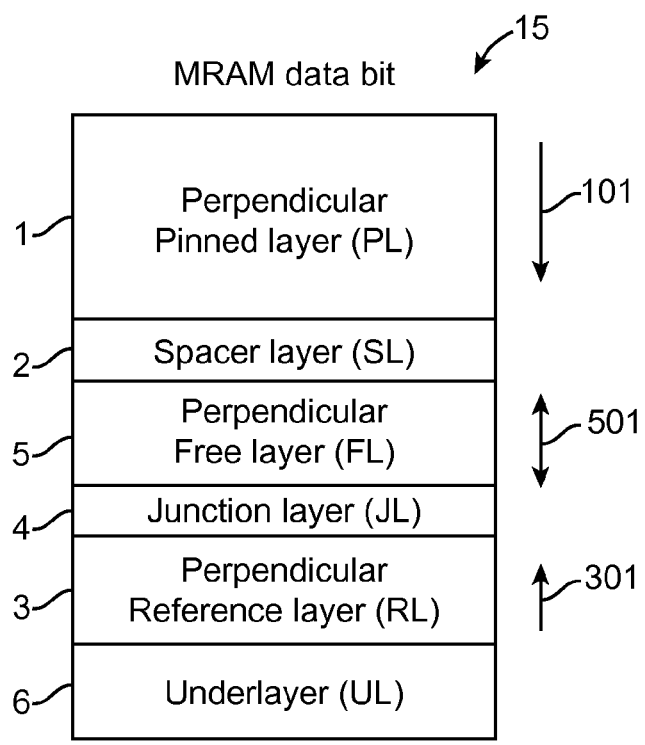
FIGS. 9 and 10 illustrate a MRAM element 15 and a MRAM reference element 19 which will be used in accordance with another embodiment of the invention.
Figure 10:
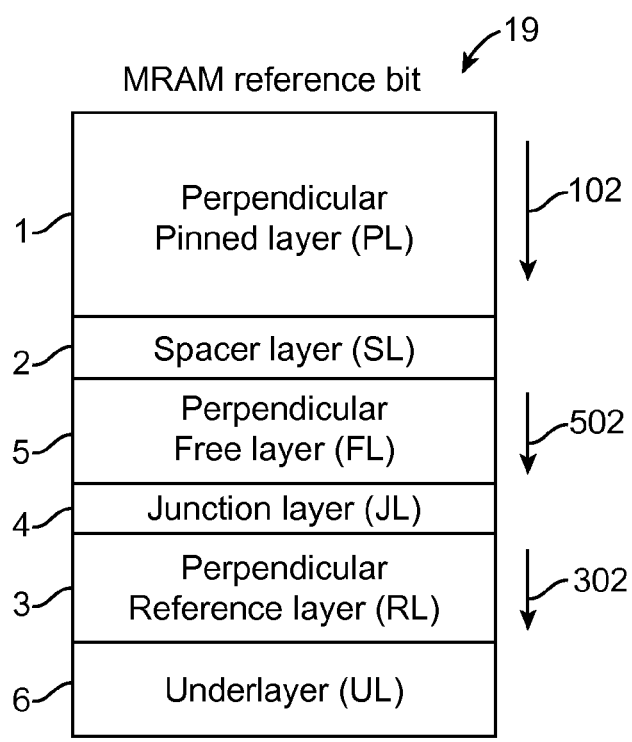

FIGS. 9 and 10 show a second type of MRAM element 15 and MRAM reference element 19 that will be used with other embodiments of the invention. Each of the elements 15 and 19 are again perpendicular in that their respective FL5, RL 3 and PL 1 have magnetizations and magnetic anisotropy that are perpendicular to the film plane or substrate on which each element is formed.

The element 15 is analogous to the element 10 however, the layer order is different with its reference layer (RL) 3 and pinned layer (PL) 1 are on an opposite side of its junction layer, in contrast to the element 10. The element 15 is shown to include an UL 6 formed on a substrate circuitry (not shown) on top of which is shown formed a perpendicular RL 3 on top of which is shown formed a JL 4 (also known herein as "barrier layer" or "tunnel layer" or "barrier tunnel layer"), on top of which is shown formed a perpendicular FL 5 on top of which is shown formed a SL 2 on top of which is shown formed a perpendicular PL 1.

Similarly, the element 19 is analogous to the element 20, with the exceptions stated above, and is made of the same layers as that of the element 15 but it serves as the reference bit to aid in reading the state of the element 15. Accordingly, the elements 15 and 19 are formed with analogous material and structures. At times, in this document, the element 15 is referred to as "MRAM data bit" or "data bit" and the element 19 is referred to as "MRAM reference bit" or "reference bit" because each of these elements stores one bit of digital information.

The FL 5, RL 3, and PL 1 of each of the elements 15 and 19, each have a perpendicular magnetic anisotropy and a magnetization that is perpendicular to the film plane. Different magnetization states of the two bits, i.e. bits 15 and 19, especially for RL 3, are achieved after the completion of an initialization process. The JL 4 may be made of, but not limited to, MgO, alumina, Cu and Cu nano-pillars within an oxide layer. When different direction of electric current is applied through the element 15, the magnetization of the FL 5 may be switched into a different orientation along with the perpendicular direction due to the spin transfer torque from the RL 3 in the element 15.

The SL 2 of both the element 15 and the element 19 may be made of a non-magnetic layer such as, but not limited to, Ru, Ta, Ti, MgO, Cu, Hf, ZnO, TaN, TiN, IrMn, PtMn, FeRh, or alumina. The SL 2 can produce an anti-ferromagnetic coupling between the FL 5 and the PL 1 and be made of Ru, Cu or MgO.

Figure 11:
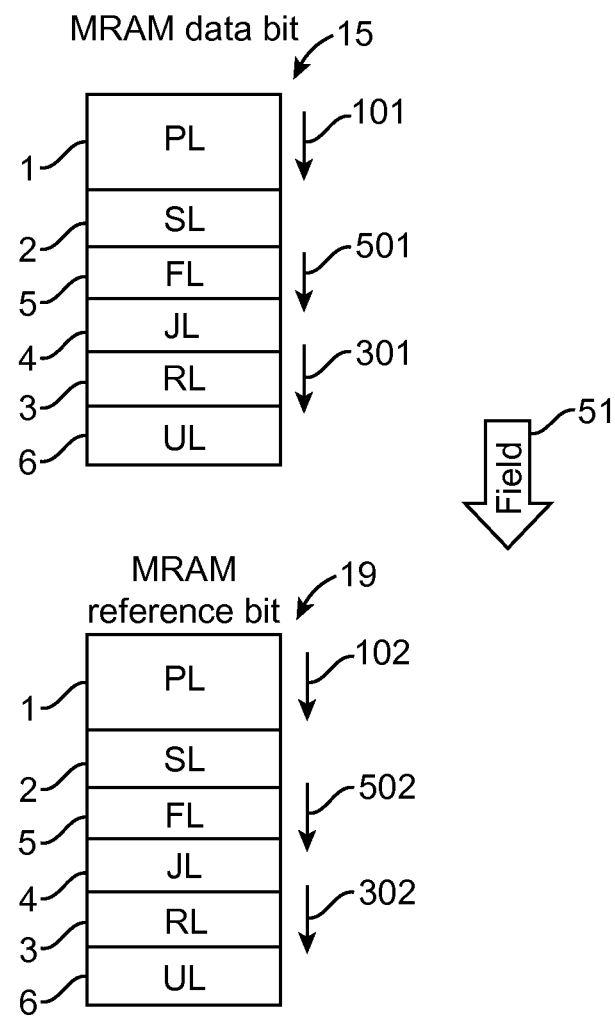
FIGS. 11-13 illustrate a process for initializing the elements 15 and 19, during manufacturing or as needed, in accordance with a method of the invention.
Figure 12:
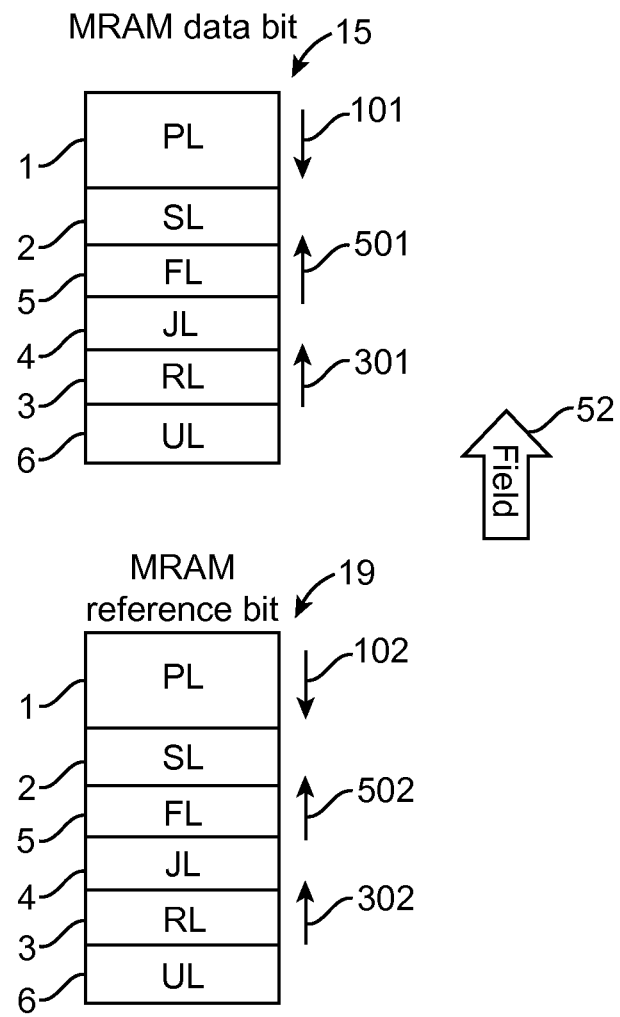
Figure 13:
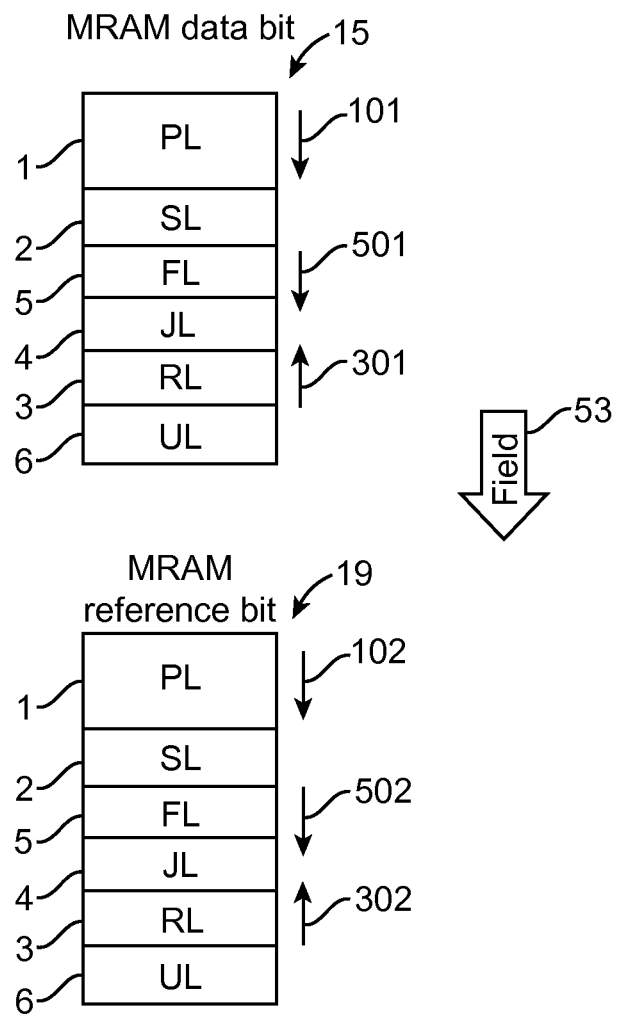

FIGS. 11-13 show the steps performed during an initialization process of each of the elements 15 and 19, in accordance with a third embodiment of the invention, to magnetize both data bit and reference bit into same common state, where RL and PL are anti-parallel to each other. In this process, the PL magnetization is assumed to be harder to switch with a magnetic field (i.e. having a higher effective coercivity field) than the RL. At step 1, in FIG. 11, a magnetic field 51, in the direction shown of the arrow, is applied to the elements 15 and 19. The field 51 is selected to be strong enough to magnetize all of the magnetic layers of the elements 15 and 19, such as the RL 3 and the FL 5 and the PL 1, in the direction shown as the direction of the arrow showing field 51. Field 51 is then removed. Next, at step 2, shown in FIG. 12, the field 52 is applied, opposite in direction from the field 51. Field 52 is weaker than field 51 and is not able to switch the PL 1 in either the element 15 or 19, but it is able to switch the magnetization of both of the layers FL 5 and RL 3 such that the magnetizations 301 and 302 of the RL 3 are oriented anti-parallel relative to that of the PL 1 in both the element 15 and the element 19. Step 2 can be used as the final step for certain applications, for example, where reference bit and data bit share same magnetization configuration and not using a stable reference bit that has magnetizations from all magnetic layers being in same direction.

As an optional step after step 2, as shown in FIG. 13, a third selected magnetic field 53 is applied to the element 15 and the element 19 after field 52 has been removed. The field 53 is in the same direction as that of the field 51. However, field 53 is weaker than field 52 and is not strong enough to switch the magnetization of the RL 3 or the PL 1, but it is suitable to switch the magnetization of the FL 5 to be in the same direction as that of the PL 1 in both the element 15 and the element 19. Accordingly, as shown in FIG. 13, the magnetization direction, shown by the arrows 501 and 502, is in the same direction as that of the arrows 101 and 102.

Figure 14:
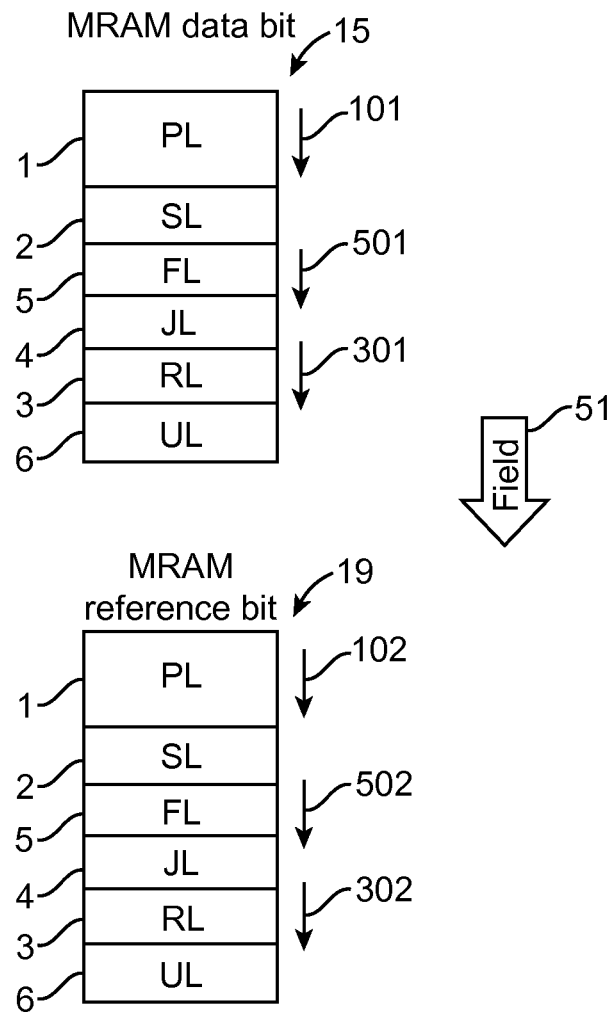
FIGS. 14-16 illustrate a process for initializing the elements 15 and 19 in accordance with another method of the invention
Figure 15:
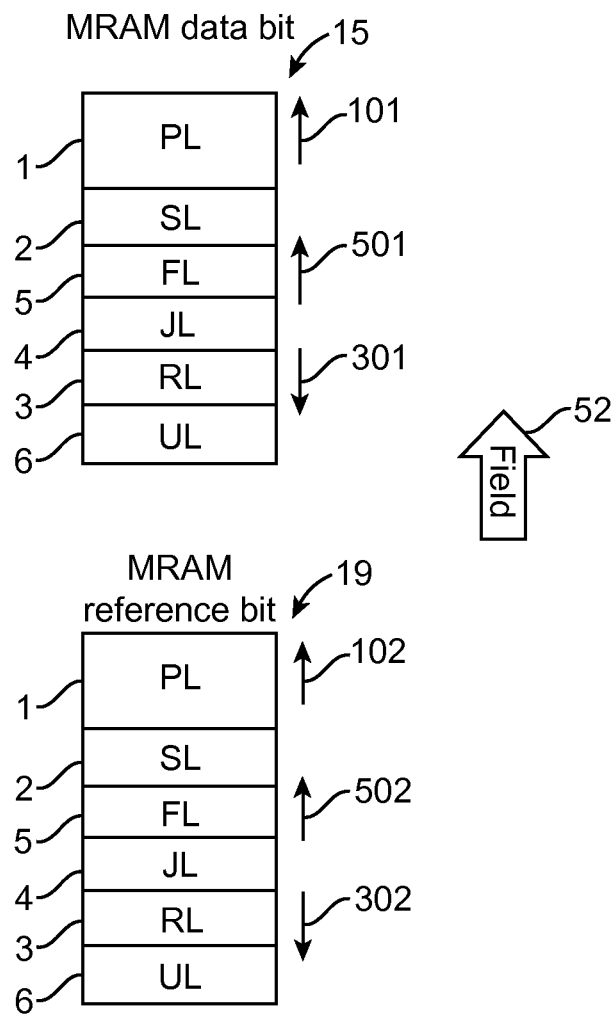
Figure 16:
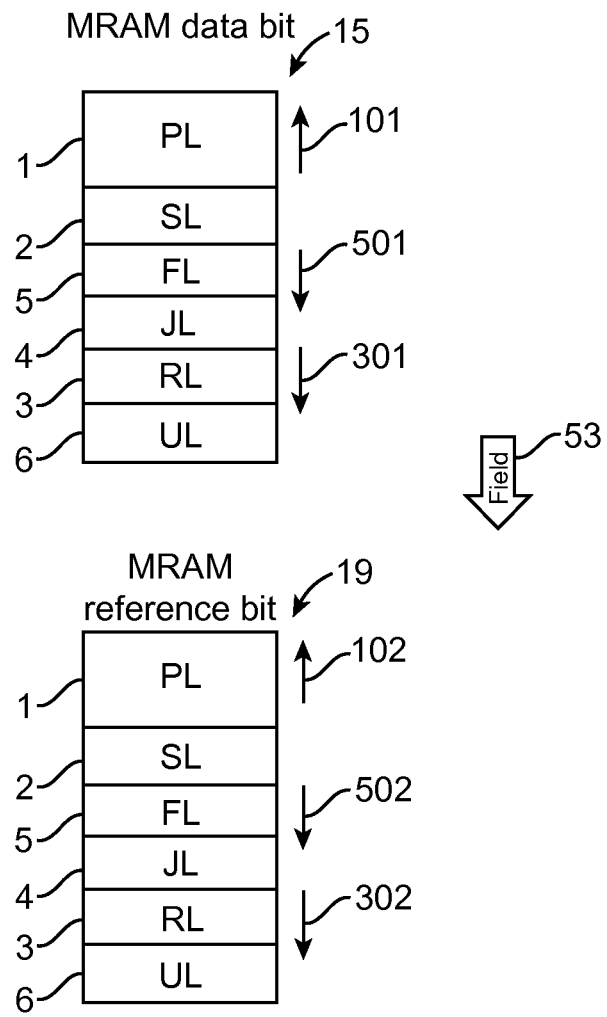

FIGS. 14-16 show a process for initializing the elements 15 and 19, during manufacturing or as needed, in accordance with a fourth embodiment of the invention, to magnetize both data bit and reference bit into same common state, where RL and PL are anti-parallel to each other. In this process, the RL magnetization is assumed to be harder to switch with a magnetic field (i.e. having a higher effective coercivity field) than the PL.

In step 1, of FIG. 14, a first field 51 is applied, in a direction shown by the arrow associated with the field 51 in FIG. 6, to the elements 15 and 19 that is selected to be strong enough to magnetize all magnetic layers of the elements 15 and 19 in the same direction as the direction of the field 51. Field 51 is then removed. Next, at step 2, shown in FIG. 15, the field 52 is applied with opposite direction to field 51. Field 52 is selected to be weaker than field 51 and is not able to switch the RL 3 in either the element 15 or 19, but it is able to switch the magnetization of both of the layers FL 5 and PL 1 such that the magnetizations 301 and 302 of the RL 3 are oriented anti-parallel relative to that of the PL 1 in both the element 15 and the element 19. Step 2 can be used as the final step for certain applications, for example, where reference bit and data bit share same magnetization configuration and when not using a stable reference bit that has magnetizations from all magnetic layers being in same direction.

As an optional step after step 2, as shown in FIG. 16, a third external magnetic field 53 is applied to the element 15 and the element 19 after field 52 has been removed. The field 53 is in the same direction as that of the field 51. However, field 53 is weaker than field 52 and is not strong enough to switch the magnetization of the RL 3 or the PL 1, but it is strong enough to switch the magnetization of the FL 5 to be in the same direction as that of the RL 3 in both the element 15 and the element 19. Accordingly, as shown in FIG. 16, the magnetization direction, shown by the arrows 501 and 502, is in the same direction as that of the arrows 301 and 302.

It needs to be further noted that the reason for having RL and PL to be anti-parallel, especially in the MTJ type data bit 10 and reference bit 15, is to make effective fields from RL and PL in FL cancel each other, such that FL switching is not affected by a significant effective offset field. It also needs to be noted that, although current invention describes reference bit as a stationary bit cell dedicated for referencing the data bit state, in selected applications, the reference bit can be a dynamic bit that is a data bit in nature but can be temporarily used as a reference bit for another one or more data bits.

In practice, step 1, step 2 and step 3 of each embodiment are preferred to be performed after all manufacture processes are completed, or at least after all MRAM annealing steps are finished. However, it is also possible that step 1 in all the embodiments can be performed during an annealing step of MRAM manufacture process, while step 2 and step 3 are performed after the annealing step (or even after entire manufacture process is completed). In such process, high temperature in the annealing process can significantly reduce the effective coercivity field in all the magnetic layers. Thus, magnitude of field 51 in step 1 can then just be high enough to overcome the effective coercivity field of each of the magnetic layers during the annealing process, which can be much lower than when performed after annealing, and field 51 is also not required to be higher in value than the field 52 or field 53 used in following step 2 and step 3.

Further, it is also possible that step 1 with field 51, and step 2 with field 52 are both performed during an environment that has a higher temperature than the temperature where the MRAM final product is supposed to be used. In such case, the higher temperature can reduce the field magnitude requirement for field 51 to magnetize all magnetic layers, and for field 52 to magnetize two of the magnetic layers.

It is understood that while only one bit is represented and shown in the various embodiments and methods of the invention, a memory array may employ and typically does employ a large number of data bits and reference bits. In some embodiments, the data bits are stacked on top of each other and the reference bits are stacked on top of each other but other arrangements are contemplated. Additionally MTJ structures from layer 1 to layer 5, in all embodiments as disclosed above can be up-side down from what is shown in the figures.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

The invention claimed is:

1. A method for initializing perpendicular magnetization directions of magnetic layers in a set of MRAM elements with each element having at least one free layer and at least first and second fixed layers, the first and second fixed layers having different coercivities, the set of MRAM elements including at least one element that serves as a reference element, the method comprising:

applying a first externally generated magnetic field to the set of MRAM elements, the first externally generated magnetic field having a first field direction and having a first field magnitude sufficient to switch magnetization directions of the free layer and the fixed layers of each element into a first perpendicular magnetization direction; and after the first externally generated magnetic field has been removed, applying a second externally generated magnetic field to the set of MRAM elements, the second externally generated magnetic field having a second field direction opposite to the first magnetic field and having a second field magnitude that is weaker than the first field magnitude, the second field magnitude being sufficient to switch the magnetization directions of the free layer and the first fixed layer into a second perpendicular magnetization direction while leaving the second fixed layer in the first perpendicular magnetization direction.

2. The method of claim 1 further comprising after the second externally generated magnetic field has been removed, applying a third externally generated magnetic field to the set of MRAM elements, the third externally generated magnetic field having the first field direction opposite to the second field direction and having a third field magnitude that is weaker than the second field magnitude, the third field magnitude being sufficient to switch the magnetization direction of the free layer while leaving the magnetization directions of the first and second fixed layers unchanged.

3. The method of claim 1 wherein applying the first externally generated magnetic field occurs when the set of MRAM elements has been heated to an elevated temperature.

4. The method of claim 1 wherein applying the first externally generated magnetic field further comprises heating the set of MRAM elements to an elevated temperature to lower the coercivities of the first and second fixed layers.

5. The method of claim 1 wherein applying the first externally generated magnetic field occurs when the set of MRAM elements has been heated to an elevated temperature during an manufacturing process is an annealing process.

6. The method of claim 1 wherein the first fixed layer is a pinned layer and the second fixed layer is a reference layer.

7. The method of claim 1 wherein the first fixed layer is a reference layer and the second fixed layer is a pinned layer.

8. The method of claim 1 wherein the free layer and a junction layer in each element are disposed between the first and second fixed layers.

9. The method of claim 1 wherein the first and second fixed layers are disposed adjacent to a spacer layer.

10. The method of claim 1 wherein the first perpendicular magnetization direction and the second perpendicular magnetization direction are substantially opposite to each other.

11. A method for initializing perpendicular magnetization directions of magnetic layers in a set of MRAM elements with each element having at least one free layer and at least first and second fixed layers, the first and second fixed layers having different coercivities, the method comprising:
  applying a first externally generated magnetic field to the set of MRAM elements, the first externally generated magnetic field having a first field direction and having a first field magnitude sufficient to switch magnetization directions of the free layer and the fixed layers of each element into a first perpendicular magnetization direction; and
  after the first externally generated magnetic field has been removed, applying a second externally generated magnetic field to the set of MRAM elements, the second externally generated magnetic field having a second field direction opposite to the first magnetic field and having a second field magnitude that is weaker than the first field magnitude, the second field magnitude being sufficient to switch the magnetization direction of the first fixed layer into a second perpendicular magnetization direction while leaving the second fixed layer in the first perpendicular magnetization direction.

12. The method of claim 11 wherein applying the first externally generated magnetic field occurs when the set of MRAM elements has been heated to an elevated temperature.

13. The method of claim 11 wherein the first perpendicular magnetization direction and the second perpendicular magnetization direction are substantially opposite to each other.

* * * * *